United States Patent [19]

Van Der Puy

[11] Patent Number: 5,182,042

[45] Date of Patent: Jan. 26, 1993

[54] AZEOTROPE-LIKE COMPOSITIONS OF 1,1,1-TRIFLUOROHEXANE AND PERFLUOROMETHYLCYCLOHEXANE

[75] Inventor: Michael Van Der Puy, Cheektowaga, Erie, N.Y.

[73] Assignee: Allied-Signal Inc., Morristown, N.J.

[21] Appl. No.: 779,687

[22] Filed: Oct. 21, 1991

[51] Int. Cl.$^5$ .......................... C11D 7/30; C11D 7/50; C23G 5/028; B08B 3/00

[52] U.S. Cl. .................................. 252/172; 134/12; 134/31; 134/38; 134/40; 134/42; 252/162; 252/364; 252/DIG. 9

[58] Field of Search ......... 252/162, 172, 364, DIG. 9; 134/12, 31, 38, 40, 42

[56] References Cited

U.S. PATENT DOCUMENTS

| | | | |
|---|---|---|---|
| 3,003,003 | 10/1961 | McGinty | 570/167 |
| 3,085,918 | 4/1963 | Sherlinker et al. | 252/153 |
| 4,169,807 | 10/1979 | Zuber | 252/171 |
| 4,219,489 | 8/1980 | Johnson et al. | 260/397.3 |
| 4,675,453 | 6/1987 | Resnick | 568/615 |
| 4,793,931 | 12/1988 | Stevens et al. | 134/10 |
| 4,803,842 | 2/1989 | Coelho et al. | 252/67 |
| 4,843,181 | 6/1989 | Gumprecht et al. | 423/595 |
| 4,851,595 | 7/1989 | Gumprecht | 570/170 |
| 5,055,138 | 10/1991 | Slinn | 134/31 |
| 5,091,104 | 2/1992 | Van Der Puy | 252/171 |

FOREIGN PATENT DOCUMENTS 62-124196  6/1987  Japan ................... 252/364

OTHER PUBLICATIONS

W. B. Burford III et al. *Industrial and Engineering Chemistry vol. 39 No. 3, p. 328 1947.*

Chemical Abstract No. 83:9118v (1975); Abstract of Dmowski et al. Rocz. Chem. 1974 vol. 48 No. 10 pp. 1697-1706.

Chemical Abstract No. 89:41906f (1978); Abstract of Dmowski et al. *Pol. J. Chem.* 1978 vol. 52 No. 3 pp. 547-549.

Commonly assigned, copending Application Serial No. 721,022, Filed Jun. 26, 1991 for "Azeotrope-Like Compositions of Teritary Butyl 2,2,2-Trifluoroethyl Ether and Perfluoromethylcyclohexane".

*Primary Examiner*—Linda D. Skaling
*Attorney, Agent, or Firm*—Colleen D. Szuch; Jay P. Friedenson

[57] ABSTRACT

Azeotrope-like compositions of 1,1,1-trifluorohexane and perfluoromethylcyclohexane which are useful in a variety of industrial cleaning applications including defluxing of printed circuit boards.

7 Claims, No Drawings

AZEOTROPE-LIKE COMPOSITIONS OF 1,1,1-TRIFLUOROHEXANE AND PERFLUOROMETHYLCYCLOHEXANE

FIELD OF THE INVENTION

This invention relates to azeotrope-like compositions of 1,1,1-trifluorohexane and perfluoromethylcyclohexane which are useful in a variety of industrial cleaning applications including defluxing of printed circuit boards.

BACKGROUND OF THE INVENTION

Fluorocarbon based solvents have been used extensively for the degreasing and otherwise cleaning of solid surfaces, especially intricate parts and difficult to remove soils. In its simplest form, vapor degreasing or solvent cleaning consists of exposing a room temperature object to be cleaned to the vapors of a boiling solvent. Vapors condensing on the object provide clean distilled solvent to wash away grease or other contamination. Final evaporation of solvent leaves the object free of residue. This is contrasted with liquid solvents which leave deposits on the object after rinsing.

A vapor degreaser is used for difficult to remove soils where elevated temperature is necessary to improve the cleaning action of the solvent, or for large volume assembly line operations where the cleaning of metal parts and assemblies must be done efficiently. The conventional operation of a vapor degreaser consists of immersing the part to be cleaned in a sump of boiling solvent which removes the bulk of the soil, thereafter immersing the part in a sump containing freshly distilled solvent near room temperature, and finally exposing the part to solvent vapors over the boiling sump which condense on the cleaned part In addition, the part can also be sprayed with distilled solvent before final rinsing.

Vapor degreasers suitable in the above-described operations are well known in the art. For example, Sherliker et al., in U.S. Pat. No. 3,085,918 disclose a suitable vapor degreaser comprising a boiling sump, a clean sump, a water separator, and other ancillary equipment.

Cold cleaning is another application where a number of solvents are used. In most cold cleaning applications, the soiled part is either immersed in the fluid or wiped with cloths soaked in solvents and allowed to air dry.

The art has looked towards azeotropic compositions preferably those which include halocarbon components like trichlorotrifluoroethane and other components which contribute additionally desired characteristics, such as polar functionality, increased solvency power, and stabilizers. Azeotropic compositions are desired because they do not fractionate upon boiling. This behavior is desirable because in the previously described vapor degreasing equipment with which these solvents are employed, redistilled material is generated for final rinse cleaning. Thus, the vapor degreasing system acts as a still. Therefore, unless the solvent composition is essentially constant boiling, (i.e., is an azeotrope or azeotrope-like) fractionation will occur and undesirable solvent distribution may act to upset the cleaning and safety of processing. For example, preferential evaporation of the more volatile components of the solvent mixtures would result in mixtures with changed compositions which may have less desirable properties, like lower solvency towards soils, less inertness towards metal, plastic or elastomer components, and increased flammability and toxicity.

The art is continually seeking new halocarbon based azeotrope mixtures or azeotrope-like mixtures which offer alternatives for new and special cleaning applications for vapor degreasing and other cleaning applications. Currently, fluorocarbon based azeotrope-like mixtures are of particular interest because they are considered to be stratospherically safe substitutes for presently used fully halogenated chlorofluorocarbons (like trichlorotrifluoroethane). The latter have been implicated in causing environmental problems associated with the depletion of the earth's protective ozone layer.

Accordingly, it is an object of the present invention to provide novel environmentally acceptable azeotropic compositions which are useful in a variety of industrial cleaning applications.

It is another object of the invention to provide azeotrope-like compositions which are liquid at room temperature and which will not fractionate under conditions of use.

Other objects and advantages of the invention will become apparent from the following description.

SUMMARY OF THE INVENTION

The invention relates to azeotrope-like compositions of 1,1,1-trifluorohexane and perfluoromethylcyclohexane which are useful in a variety of industrial cleaning applications including defluxing of printed circuit boards.

DETAILED DESCRIPTION OF THE INVENTION

In accordance with the invention, novel azeotrope-like compositions have been discovered comprising 1,1,1-trifluorohexane and perfluoromethylcyclohexane. Preferably, the azeotrope-like compositions comprise from about 18 to about 61 weight percent 1,1,1-trifluorohexane and from about 39 to about 82 weight percent perfluoromethylcyclohexane and boil at about 66.4.C. ±0.5° C. at 746 mm Hg.

In a more preferred embodiment, the azeotrope-like compositions of the invention comprise from about 18 to about 49 weight percent 1,1,1-trifluorohexane and from about 51 to about 82 weight percent perfluoromethylcyclohexane.

In a most preferred embodiment, the azeotrope-like compositions of the invention comprise from about 18 to about 25 weight percent 1,1,1-trifluorohexane and from about 75 to about 82 weight percent perfluoromethylcyclohexane.

The 1,1,1-trifluorohexane component of the invention has good solvent properties, but is flammable. The perfluoromethylcyclohexane component has poorer solvent properties but is nonflammable. When these components are combined in effective amounts, a synergistic blend having azeotropic properties results which is nonflammable and has good solvent capabilities.

Other additives like alcohols may be added to the solvent composition of the invention to change the polarity of the solvent blend enabling the solvent to dissolve more polar contaminants or soils. Suitable alcohols include methanol, ethanol, isopropanol, butanol and mixtures thereof.

The perfluoromethylcyclohexane ($C_7F_{14}$, m.p. −37° C., b.p. 76° C.) component of the invention is commercially available. It may be purchased, for example, from PCR, Inc. of Gainsville, Fl. Alternately, it may be prepared via cobalt trifluoride fluorination of benzotrifluoride. See, W. B. Burford, III, et al., *Ind. Eng. Chem.*, 1947, 39, 319. The 1,1,1-trifluorohexane component of the invention may be prepared in accordance with the synthesis set forth in Example 1 below. Other methods of preparing perfluoromethylcyclohexane and 1,1,1-trifluorohexane will readily occur to those skilled in the art.

The perfluoromethylcyclohexane and 1,1,1-trifluorohexane components of the invention should be used in sufficiently high purity so as to avoid the introduction of adverse influences upon the constant boiling properties of the system.

The precise or true azeotrope compositions have not been determined but have been ascertained to be within the indicated ranges. Regardless of where the true azeotrope lies, all compositions within the indicated ranges, as well as certain compositions outside the indicated ranges, are azeotrope-like, as defined more particularly below.

From fundamental principles, the thermodynamic state of a fluid is defined by four variables: pressure, temperature, liquid composition and vapor composition, or P-T-X-Y, respectively. An azeotrope is a unique characteristic of a system of two or more components where X and Y are equal at the stated P and T. In practice, this means that the components of a mixture cannot be separated during distillation, and therefore are useful in vapor phase solvent cleaning as described above.

For purposes of this discussion, the term "azeotrope-like composition" is intended to mean that the composition behaves like a true azeotrope in terms of its constant-boiling characteristics or tendency not to fractionate upon boiling or evaporation. Such composition may or may not be a true azeotrope. Thus, in such compositions, the composition of the vapor formed during boiling or evaporation is identical or substantially identical to the original liquid composition. Hence, during boiling or evaporation, the liquid composition, if it changes at all, changes only slightly. This is contrasted with non-azeotrope-like compositions in which the liquid composition changes substantially during boiling or evaporation.

Thus, one way to determine whether a candidate mixture is "azeotrope-like" within the meaning of this invention, is to distill a sample thereof under conditions (i.e. resolution— number of plates) which would be expected to separate the mixture into its components. If the mixture is non-azeotropic or non-azeotrope-like, the mixture will fractionate, (i.e. separate into its various components) with the lowest boiling component distilling off first, etc. If the mixture is azeotrope-like, some finite amount of a first distillation cut will be obtained which contains all of the mixture components and which is constant boiling or behaves as a single substance. This phenomenon cannot occur if the mixture is not azeotrope-like (i.e., it is not part of an azeotropic system). If the degree of fractionation of the candidate mixture is unduly great, then a composition closer to the true azeotrope must be selected to minimize fractionation. Of course, upon distillation of an azeotrope-like composition such as in a vapor degreaser, the true azeotrope will form and tend to concentrate.

It follows from the above discussion that another characteristic of azeotrope-like compositions is that there is a range of compositions containing the same components in varying proportions which are azeotrope-like. All such compositions are intended to be covered by the term azeotrope-like as used herein. As an example, it is well known that at different pressures, the composition of a given azeotrope will vary at least slightly as does the boiling point of the composition. Thus, an azeotrope of A and B represents a unique type of relationship but with a variable composition depending on temperature and/or pressure. Accordingly, another way of defining azeotrope-like within the meaning of this invention is to state that such mixtures boil within about ±2° C. (at 746 mm Hg) of the 65.9° C. boiling point disclosed herein. As is readily understood by persons skilled in the art, the boiling point of the azeotrope will vary with the pressure.

In the process embodiment of the invention, the azeotrope-like compositions of the invention may be used to clean solid surfaces by treating said surfaces with said compositions in any manner well known to the art such as by dipping or spraying or use of conventional degreasing apparatus.

When the present azeotrope-like compositions are used to clean solid surfaces by spraying the surfaces with the compositions, preferably, the azeotrope-like compositions are sprayed onto the surfaces by using a propellant. Preferably, the propellant is selected from the group consisting of nonflammable chlorofluorocarbons, hydrochlorofluorocarbons, hydrofluorocarbons, carbon dioxide, nitrogen, nitrous oxide, air, and mixtures thereof.

Useful chlorofluorocarbon propellants include trichlorofluoromethane (known in the art as CFC-11), dichlorodifluoromethane (known in the art as CFC-12), 1,1,2-trichloro-1,2,2-trifluoroethane (known in the art as CFC-113), and 1,2-dichloro-,1,1,2,2-tetrafluoroethane (known in the art as CFC-114); commercially available CFC-11, CFC-12, CFC-113, and CFC-114 may be used in the present invention.

Useful hydrochlorofluorocarbon propellants include dichlorofluoromethane (known in the art as HCFC-21), chlorodifluoromethane (known in the art as HCFC-22), 1-chloro-1,2,2,2-tetrafluoroethane (known in the art as HCFC-124), 1,1-dichloro-2,2-difluoroethane (known in the art as HCFC-132a), 1-chloro-2,2,2-trifluoroethane (known in the art as HCFC-133), and 1-chloro-1-difluoroethane (known in the art as HCFC-42b); commercially available HCFC-21, HCFC-22 and HCFC-42b may be used in the present invention. HCFC-24 may be prepared by a known process such as that taught by U.S. Pat. No. 4,843,181 and HCFC-133 may be prepared by a known process such as that taught by U.S. Pat. No. 3,003,003.

Useful hydrofluorocarbon propellants include trifluoromethane (known in the art as HFC-23), 1,1,1,2-tetrafluoroethane (known in the art as HFC-34a), and 1,1-difluoroethane (known in the art as HFC-152a); commercially available HFC-23 and HFC-152a may be used in the present invention. Until HFC-134a becomes available in commercial quantities, HFC-134a may be prepared by any known method such as that disclosed by U.S. Pat. NO. 4,851,595. More preferred propellants include hydrochlorofluorocarbons and hydrofluorocarbons. The most preferred propellants include chlorodifluoromethane and 1,1,1,2-tetrafluoroethane.

Having described the invention in detail and with reference to preferred embodiments thereof, it will be apparent that modifications and variations are possible without departing from the scope of the invention defined in the appended claims.

The present invention is more fully illustrated by the following non-limiting Examples.

EXAMPLE 1

Preparation of 1,1,1-trifluorohexane

A 600 Ml autoclave containing 22.5 Ml (0.179 mol) hexanoic acid was cooled to −40° C. and charged with 60 g (0.556 mol) sulfur tetrafluoride. The contents were heated and stirred at 130° C. for 6 hours, cooled, and then vented through a KOH scrubber. The contents of the autoclave were poured onto ice and water (100 Ml) and steam distilled. The organic layer was separated and dried (MgSO$_4$) to afford 15 g 1,1,1-trifluorohexane, bp 75 ° C. $^1$H NMR (CDCl$_3$): δ1.7-2.3 (m, 2H), 1.2-1.7 (m, 6H), 0.7-2 (m, 3H). $^{19}$F NMR (CDCl$_3$): 67 ppm (t, J=12 Hz).

EXAMPLE 2

The compositional range over which 1,1,1-trifluorohexane and perfluoromethylcyclohexane exhibit constant boiling behavior was determined using ebulliometry. The ebulliometer consisted of a heated sump in which the perfluoromethylcyclohexane was brought to a boil. The upper part of the ebulliometer connected to the sump was cooled, thereby acting as a condenser for the boiling vapors, allowing the system to operate at total reflux. After bringing the perfluoromethylcyclohexane to a boil at atmospheric pressure, measured amounts of 1,1,1-trifluorohexane were titrated into the ebulliometer. The change in boiling point was measured using a mercury thermometer graduated from 50 to 80° C. in 0.1° C. increments.

The results indicated that compositions of 1,1,1-trifluorohexane and perfluoromethylcyclohexane ranging from about 18 to about 61 weight percent 1,1,1-trifluorohexane and from about 39 to about 82 weight percent perfluoromethylcyclohexane exhibit constant boiling behavior at about 66.4° C. 35 0.5° C. at 746 mm Hg.

EXAMPLE 3

The ability of a liquid composition to clean in cold cleaning, precision cleaning and related applications is highly dependent upon the ability of the material to substantially dissolve greases, oils, fluxes, and other contaminants (as opposed to physically removing soils as by wiping or spraying). We have therefore determined the solubility of model soils in the novel azeotropic solvent as an indication of its utility in cleaning applications as follows:

A 72.5/27.5 weight percent mixture of perfluoromethylcyclohexane and 1,1,1-trifluorohexane respectively was prepared. To this mixture was added 7 volume percent mineral oil. The solvent/mineral oil mixture was refluxed. The 1,1,1-trifluorohexane and perfluoromethylcyclohexane mixture readily dissolved the mineral oil at reflux as determined by visual inspection and consequently, would remove soils of this type under vapor degreasing conditions.

EXAMPLE 4

The flash point of a 26.7/73.3 weight percent mixture of 1,1,1-trifluorohexane and perfluoromethylcyclohexane respectively was determined using the SETA flash closed-cup flashpoint tester. The 1,1,1-trifluorohexane and perfluoromethylcyclohexane mixture failed to exhibit a closed cup flashpoint up to an operating temperature of 150° F. Consequently, all azeotrope-like compositions having greater than 73.3 weight percent perfluoromethylcyclohexane would also be expected not to have a SETA flashpoint, since they would have even higher proportions of the nonflammable perfluoromethylcyclohexane component (i.e., mixtures with about 73 to about 78 weight percent perfluoromethylcyclohexane).

Having described the invention in detail and by reference to preferred embodiments thereof, it will be apparent that modifications and variations are possible without departing from the scope of the invention defined in the appended claims.

What is claimed:

1. Azeotrope-like compositions consisting essentially of from about 18 to about 61 weight percent 1,1,1-trifluorohexane and from about 39 to about 82 weight percent perfluoromethylcyclohexane of the formula C$_7$F$_{14}$ which boil at about 66.4° C. at 746 mm Hg.

2. The azeotrope-like composition of claim 1 wherein said composition boils at 66.4° C. ±about 0.5° C. at 746 mm Hg.

3. The azeotrope-like compositions of claim 1 wherein said compositions consist essentially of from about 18 to about 49 weight percent 1,1,1-trifluorohexane and from about 51 to about 82 weight percent perfluoromethylcyclohexane.

4. The azeotrope-like compositions of claim 1 wherein said compositions consist essentially of from about 18 to about 25 weight percent 1,1,1-trifluorohexane and from about 75 to about 82 weight percent perfluoromethylcyclohexane.

5. A method of cleaning a solid surface comprising treating said surface with an azeotrope-like composition of claim 1.

6. A method of cleaning a solid surface comprising treating said surface with an azeotrope-like composition of claim 3.

7. A method of cleaning a solid surface comprising treating said surface with an azeotrope-like composition of claim 4.

* * * * *